United States Patent
Lam et al.

(10) Patent No.: US 9,064,960 B2
(45) Date of Patent: Jun. 23, 2015

(54) SELECTIVE EPITAXY PROCESS CONTROL

(75) Inventors: Andrew Lam, San Francisco, CA (US); Yihwan Kim, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1362 days.

(21) Appl. No.: 11/669,550

(22) Filed: Jan. 31, 2007

(65) Prior Publication Data

US 2008/0182397 A1    Jul. 31, 2008

(51) Int. Cl.
  *C30B 25/04*    (2006.01)
  *H01L 29/78*    (2006.01)
  *C30B 23/04*    (2006.01)
  *H01L 21/02*    (2006.01)
  (Continued)

(52) U.S. Cl.
  CPC ............. *H01L 29/7834* (2013.01); *C30B 25/04* (2013.01); *C30B 23/04* (2013.01); *C30B 35/00* (2013.01); *H01L 21/02529* (2013.01); *H01L 21/02532* (2013.01); *H01L 21/02573* (2013.01); *H01L 21/0262* (2013.01); *H01L 21/02636* (2013.01); *H01L 21/823807* (2013.01); *H01L 21/823814* (2013.01); *H01L 29/165* (2013.01); *H01L 29/6656* (2013.01); *H01L 29/66636* (2013.01); *H01L 29/7848* (2013.01)

(58) Field of Classification Search
  CPC ........ C30B 25/02; C30B 25/04; C30B 23/04; C30B 35/00; H01L 21/0262
  USPC .......... 117/89, 92, 95, 96, 101, 105; 118/719, 118/725; 257/E21.17; 427/248.1; 438/680
  See application file for complete search history.

(56) References Cited

U.S. PATENT DOCUMENTS 3,650,042 A * 3/1972 Boerger et al. ................. 34/611
3,757,733 A * 9/1973 Reinberg ..................... 118/725
(Continued)

FOREIGN PATENT DOCUMENTS

JP         6232060      8/1994
JP       2002057115     2/2002
(Continued)

OTHER PUBLICATIONS

Bauer, M., "Tensile Strained Selective Silicon Carbon Alloys for Recessed Source Drain Areas of Devices", *Abstract 210th ECS Meeting* Oct. 29 through Nov. 3, 2006.
(Continued)

*Primary Examiner* — Matthew Song
(74) *Attorney, Agent, or Firm* — Servilla Whitney LLC

(57) ABSTRACT

Methods of selectively and epitaxially forming a silicon-containing material on a substrate surface contained within a process chamber are provided. In one or more embodiments, the pressure in the process chamber is reduced during deposition of material on the substrate and increased during etching of material from the substrate. According to an embodiment, process gases are flowed into the chamber through first zone and a second zone to provide a ratio of the amount of gas flowed to the first zone and the amount of gas flowed to the second zone. In one or more embodiments, the first zone is an inner radial zone and the second zone is an outer radial zone, and ratio of inner zone gas flow to outer zone gas flow is less during deposition than during etching. According to one or more embodiments, the selective epitaxial process includes repeating a cycle of a deposition and then an etching process, and an optional purge until the desired thickness of an epitaxial layer is grown.

17 Claims, 3 Drawing Sheets

(51) Int. Cl.
*H01L 29/165* (2006.01)
*H01L 29/66* (2006.01)
*C30B 35/00* (2006.01)
*H01L 21/8238* (2006.01)

(56) References Cited

U.S. PATENT DOCUMENTS

| | | | |
|---|---|---|---|
| 4,900,591 A * | 2/1990 | Bennett et al. | 427/255.17 |
| 4,976,996 A * | 12/1990 | Monkowski et al. | 427/255.5 |
| 5,108,792 A | 4/1992 | Anderson et al. | |
| 5,179,677 A | 1/1993 | Anderson et al. | |
| 5,186,718 A | 2/1993 | Tepman et al. | |
| 5,207,835 A * | 5/1993 | Moore | 118/725 |
| 5,378,651 A * | 1/1995 | Agnello et al. | 438/489 |
| 5,854,095 A * | 12/1998 | Kang et al. | 438/255 |
| 5,976,261 A * | 11/1999 | Moslehi et al. | 118/719 |
| 6,083,321 A | 7/2000 | Lei et al. | |
| 6,184,154 B1 * | 2/2001 | Dietze et al. | 438/762 |
| 6,221,742 B1 | 4/2001 | Park et al. | |
| 6,232,196 B1 * | 5/2001 | Raaijmakers et al. | 438/386 |
| 6,428,859 B1 * | 8/2002 | Chiang et al. | 427/457 |
| 6,468,924 B2 * | 10/2002 | Lee et al. | 438/763 |
| 6,803,297 B2 | 10/2004 | Jennings et al. | |
| 6,821,825 B2 | 11/2004 | Todd et al. | |
| 6,875,271 B2 * | 4/2005 | Glenn et al. | 117/89 |
| 6,897,131 B2 | 5/2005 | Ramachandran et al. | |
| 6,900,115 B2 * | 5/2005 | Todd | 438/478 |
| 6,916,398 B2 * | 7/2005 | Chen et al. | 156/345.33 |
| 6,998,153 B2 | 2/2006 | Chiang et al. | |
| 7,132,338 B2 | 11/2006 | Samoilov et al. | |
| 7,312,128 B2 * | 12/2007 | Kim et al. | 438/300 |
| 7,405,158 B2 * | 7/2008 | Lai et al. | 438/680 |
| 7,521,365 B2 * | 4/2009 | Kim et al. | 438/694 |
| 7,560,352 B2 * | 7/2009 | Carlson et al. | 438/300 |
| 7,572,715 B2 * | 8/2009 | Kim et al. | 438/488 |
| 7,588,980 B2 * | 9/2009 | Kim et al. | 438/222 |
| 7,598,178 B2 * | 10/2009 | Samoilov et al. | 438/706 |
| 7,605,060 B2 * | 10/2009 | Meunier-Beillard et al. | 438/478 |
| 2001/0028924 A1 * | 10/2001 | Sherman | 427/255.28 |
| 2001/0034123 A1 * | 10/2001 | Jeon et al. | 438/643 |
| 2002/0031618 A1 * | 3/2002 | Sherman | 427/569 |
| 2002/0068458 A1 * | 6/2002 | Chiang et al. | 438/694 |
| 2002/0094689 A1 * | 7/2002 | Park | 438/694 |
| 2002/0104481 A1 * | 8/2002 | Chiang et al. | 118/723 I |
| 2002/0106846 A1 * | 8/2002 | Seutter et al. | 438/200 |
| 2003/0079686 A1 * | 5/2003 | Chen et al. | 118/715 |
| 2003/0094903 A1 * | 5/2003 | Tao et al. | 315/111.91 |
| 2003/0129811 A1 * | 7/2003 | Raaijmakers et al. | 438/481 |
| 2004/0224089 A1 | 11/2004 | Singh et al. | |
| 2005/0079691 A1 | 4/2005 | Kim et al. | |
| 2005/0188923 A1 * | 9/2005 | Cook et al. | 118/728 |
| 2005/0279997 A1 * | 12/2005 | Shin et al. | 257/49 |
| 2006/0115933 A1 * | 6/2006 | Ye et al. | 438/139 |
| 2006/0115934 A1 * | 6/2006 | Kim et al. | 438/149 |
| 2006/0166414 A1 * | 7/2006 | Carlson et al. | 438/149 |
| 2006/0216876 A1 | 9/2006 | Kim et al. | |
| 2006/0234488 A1 | 10/2006 | Kim et al. | |
| 2006/0240630 A1 | 10/2006 | Bauer et al. | |
| 2007/0161216 A1 * | 7/2007 | Bauer | 438/503 |
| 2007/0246354 A1 * | 10/2007 | Ellul et al. | 204/298.02 |
| 2007/0287272 A1 * | 12/2007 | Bauer et al. | 438/485 |
| 2008/0014721 A1 | 1/2008 | Bauer | |
| 2008/0060938 A1 * | 3/2008 | Miller et al. | 204/298.03 |
| 2008/0066684 A1 * | 3/2008 | Patalay et al. | 118/728 |
| 2008/0069951 A1 * | 3/2008 | Chacin et al. | 427/248.1 |
| 2008/0182397 A1 * | 7/2008 | Lam et al. | 438/607 |
| 2008/0210163 A1 * | 9/2008 | Carlson et al. | 118/715 |

FOREIGN PATENT DOCUMENTS

| | | |
|---|---|---|
| JP | 20050183514 | 7/2005 |
| JP | 2005294690 | 10/2005 |
| KR | 10-2005-0119991 | 12/2005 |
| KR | 10-0642646 | 10/2006 |
| TW | 497208 | 8/2002 |
| WO | WO-2006/060543 | 6/2006 |

OTHER PUBLICATIONS

"PCT/US 07/87061—Apr. 16, 2008—Search Report".
"PCT/US 07/87061—Apr. 16, 2008—Written Opinion".
Final Office Action for U.S. Appl. No. 11/609,590, of Mar. 10, 2009, 16 pgs.
Non-Final Office Action in U.S. Appl. No. 11/609,608, mailed Feb, 9, 2009, 20 ogs.
"Korean Office Action dated Jul. 30, 2009 for Korean Patent Application No. 10-2007-0140826 filed Dec. 28, 2007", 3 pgs.
"USPTO Non-Final Office Action in related case U.S. Appl. No. 11/609,608 mailed Oct. 29, 2009", 20 pgs.
USPTO Non-Final Office Action mailed Sep. 5, 2008 for U.S. Appl. No. 11/609,590, filed Dec. 12, 2006, 15 pgs.

* cited by examiner

SELECTIVE EPITAXY PROCESS CONTROL

TECHNICAL FIELD

Embodiments of the invention generally relate to the field of electronic manufacturing processes and devices, more particular, to methods of depositing silicon-containing films while forming electronic devices.

BACKGROUND

As smaller transistors are manufactured, ultra shallow source/drain junctions are becoming more challenging to produce. Generally, sub-100 nm CMOS (complementary metal-oxide semiconductor) devices require a junction depth to be less than 30 nm. Selective epitaxial deposition is often utilized to form epilayers of silicon-containing materials (e.g., Si, SiGe and SiC) into the junctions. Generally, selective epitaxial deposition permits growth of epitaxial layers ("epilayers") on silicon moats with no growth on dielectric areas. Selective epitaxy can be used to manufacturer features within semiconductor devices, such as elevated source/drains, source/drain extensions, contact plugs or base layer deposition of bipolar devices.

Generally, a selective epitaxy process involves a deposition reaction and an etch reaction. The deposition and etch reactions occur simultaneously with relatively different reaction rates for an epitaxial layer and for a polycrystalline layer. During the deposition process, the epitaxial layer is formed on a monocrystalline surface while a polycrystalline layer is deposited on at least a second layer, such as an existing polycrystalline layer and/or an amorphous layer. However, the deposited polycrystalline layer is generally etched at a faster rate than the epitaxial layer. Therefore, by changing the concentration of an etchant gas, the net selective process results in deposition of epitaxy material and limited, or no, deposition of polycrystalline material. For example, a selective epitaxy process may result in the formation of an epilayer of silicon-containing material on a monocrystalline silicon surface while no deposition is left on the spacer.

Selective epitaxial deposition of silicon-containing materials has become a useful technique during formation of elevated source/drain and source/drain extension features, for example, during the formation of silicon-containing MOSFET (metal oxide semiconductor field effect transistor) devices. Source/drain extension features are manufactured by etching a silicon surface to make a recessed source/drain feature and subsequently filling the etched surface with a selectively grown epilayers, such as a silicon germanium (SiGe) material. Selective epitaxy permits near complete dopant activation with in-situ doping, so that the post annealing process is omitted. Therefore, junction depth can be defined accurately by silicon etching and selective epitaxy. On the other hand, the ultra shallow source/drain junction inevitably results in increased series resistance. Also, junction consumption during silicide formation increases the series resistance even further. To compensate for junction consumption, an elevated source/drain is epitaxially and selectively grown on the junction. Typically, the elevated source/drain layer is undoped silicon.

However, current selective epitaxy processes have some drawbacks. To maintain selectivity during present epitaxial processes, chemical concentrations of the precursors, as well as reaction temperatures must be regulated and adjusted throughout the deposition process. If not enough silicon precursor is administered, then the etching reaction may dominate and the overall process is slowed down. Also, harmful over-etching of substrate features may occur. If not enough etchant precursor is administered, then the deposition reaction may dominate reducing the selectivity to form monocrystalline and polycrystalline materials across the substrate surface. Also, current selective epitaxy processes usually require a high reaction temperature, such as above 800° C., 1000° C. or higher. Such high temperatures are not desirable during a fabrication process due to thermal budget considerations and possible uncontrolled nitridation reactions to the substrate surface. In addition, processing in the conventional manner with simultaneous deposition and etching at temperatures lower than about 800° C. results in unacceptably low growth rates.

Therefore, there is a need to have a process for selectively and epitaxially depositing silicon and silicon-containing compounds. It would be desirable to provide processes for depositing such compounds with optional dopants. Furthermore, the process should be versatile to form silicon-containing compounds with varied elemental concentrations while having a fast deposition rate and maintaining a process temperature, such as about 800° C. or less.

SUMMARY

According to one embodiment, a method of selectively and epitaxially forming a silicon-containing material on a substrate surface comprises:

a) placing a substrate comprising a monocrystalline surface and at least a dielectric surface into a process chamber, the process chamber including a first zone and a second zone;

b) exposing the substrate to a silicon-containing deposition gas and maintaining the pressure in the process chamber below about 50 Torr to form an epitaxial layer on the monocrystalline surface and a second material on the dielectric surface; and c) subsequently stopping the flow of deposition gas to the process chamber, increasing the pressure in the process chamber and exposing the substrate to an etchant gas to maintain a relatively high etchant gas partial pressure and to etch the second material;

d) subsequently stopping the flow of etchant gas to the process chamber and flowing a purge gas into the process chamber; and e) sequentially repeating steps b), c) and d) at least once.

In one embodiment, the method further comprises controlling the gas flow to the first zone to the second zone to provide a ratio of first zone gas flow to second zone gas flow and changing the ratio of first zone gas flow to second zone gas flow so that the ratio is different during step b) and step c). In certain embodiments, the first zone includes an inner radial zone and the second zone includes an outer radial zone and the gas is flowed in a manner to provide a ratio of inner zone gas flow to outer zone gas flow (I/O) into the process chamber, and maintaining the I/O below about one during exposure of the substrate to the deposition gas and maintaining I/O above about one during exposure of the substrate to the etchant gas. According to certain embodiments, substantially no etchant gas is flowed into the process chamber while the deposition gas is flowing into the process chamber. In one or more embodiments, the I/O is between about 0.2 and 1.0 during exposure of the substrate to the deposition gas and the I/O is greater than about 1.0 and less than about 6.0 during exposure of the substrate to the etchant gas.

According to certain embodiments, the pressure in the process chamber during exposure to the etchant gas is at least about twice the pressure in the process chamber during exposure of the substrate to the deposition gas. In one or more embodiments, the pressure in the process chamber during exposure to the etchant gas is at between about two to about ten times the pressure in the process chamber during exposure of the substrate to the deposition gas. According to one or more embodiments, the temperature in the process is maintained below about 800° C., for example, below about 750° C. during the entire process.

In another embodiment, a method of selectively and epitaxially forming a silicon-containing material on a substrate surface comprises: placing a substrate comprising a monocrystalline surface and at least a dielectric surface into a process chamber, the process chamber including a first gas flow zone and second gas flow zone; flowing a silicon-containing deposition gas into the process chamber at a first pressure and into the first zone and second zone to provide deposition gas flow ratio of the first zone to the second zone of less than one; and subsequently stopping the flow of deposition gas to the process chamber, increasing the pressure in the process chamber to a second pressure and flowing an etchant gas into the inner radial zone and outer radial zone of process chamber at an etchant gas flow ratio of the first zone gas flow to second zone gas flow of greater than one; subsequently stopping the flow of etchant gas to the process chamber and flowing a purge gas into the process chamber; and repeating at least once the sequential steps of flowing the deposition gas, flowing the etchant gas and flowing the purge gas until a silicon-containing material with a desired thickness is formed. In one or more embodiments, the increased pressure during etching results in an increased substrate temperature, and during purging, the pressure is decreased resulting in a decreased substrate temperature.

In one embodiment, the second pressure is at least twice the first pressure. In certain embodiments, the second pressure is between about 5 and 10 times the first pressure. According to an embodiment, the ratio of the gas flow of the first zone to the second zone during flow of the deposition gas is between about 0.2 and 1.0. In one or more embodiments, the ratio of gas flow of the first zone to the second zone during the flow of etchant gas is greater than about 1.0 and less than about 6.0.

In another embodiment, a method of selectively and epitaxially forming a silicon-containing material on a substrate surface comprises: placing a substrate comprising a monocrystalline surface and at least a dielectric surface into a process chamber, the process chamber including a first gas flow zone and second gas flow zone; performing a deposition step comprising flowing a silicon-containing gas into the process chamber during which no etchant gas is flowed into the process chamber; performing an etching step comprising flowing an etchant gas into the process chamber during which no silicon-containing gas is flowed into the process chamber; and performing a purging step during which a purging gas is flowed, wherein a single process cycle comprises a deposition step, an etching step and a purging step and the process cycle is repeated at least once, and gas is flowed to the first zone and second zone to provide a pressure in the process chamber and a gas flow ratio between the first zone and second zone during each of the deposition step, etching step and purging step and at least one of the pressure in the process chamber or the gas flow ratio is different during the deposition step and the etching step. In one embodiment, the pressure in the process is lower during deposition than during etching. In certain embodiments, the lower pressure in the process chamber results in a decreased substrate temperature.

In one embodiment, the ratio of gas flow of the first zone to the second zone is less during the deposition step than during the etching step. In one embodiment, the first zone comprises an inner radial zone of the process chamber and the second zone comprises an outer radial zone of the chamber. In certain embodiments, the pressure during etching is at least twice the pressure during deposition. In one or more embodiments, the process is performed at a temperature of less than about 800° C.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
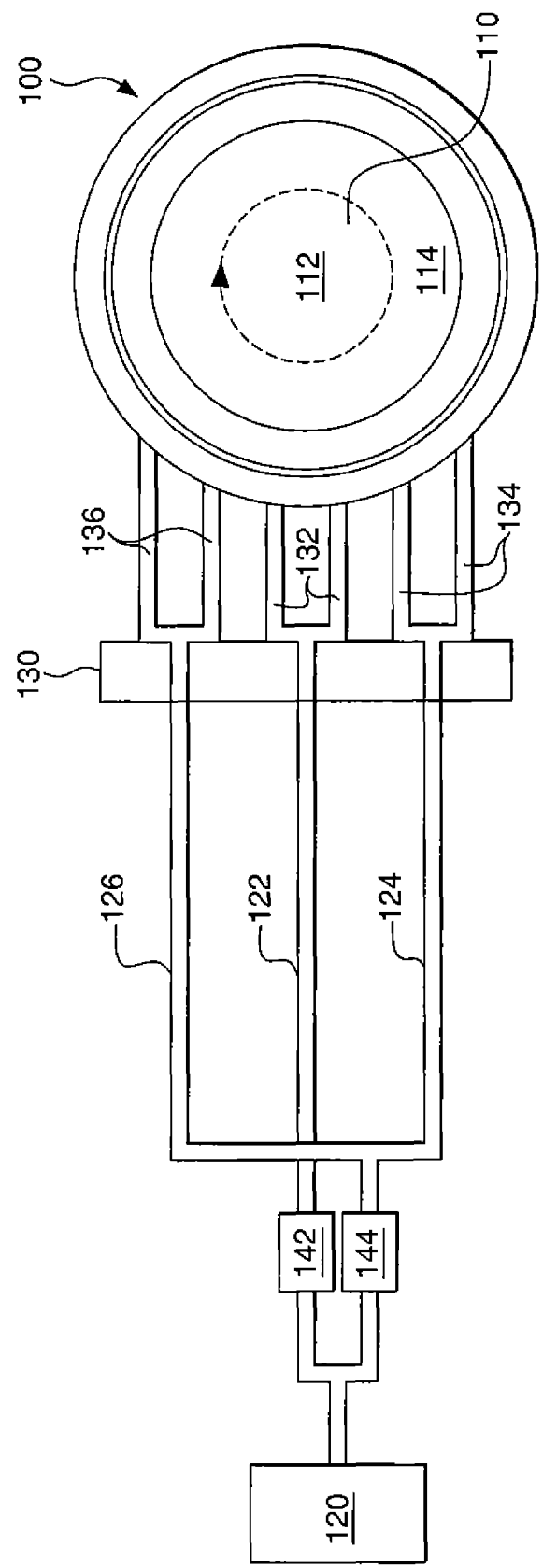
FIG. 1 is a schematic top plan view of a processing chamber and a gas distribution system according to one embodiment.

Before describing several exemplary embodiments of the invention, it is to be understood that the invention is not limited to the details of construction or process steps set forth in the following description. The invention is capable of other embodiments and of being practiced or being carried out in various ways.

DETAILED DESCRIPTION

Embodiments of the invention generally provide processes to selectively and epitaxially deposit silicon-containing materials on monocrystalline surfaces of a substrate during fabrication of electronic devices. A patterned substrate containing a monocrystalline surface (e.g., silicon or silicon germanium) and at least a secondary surface, such as an amorphous surface and/or a polycrystalline surface (e.g., oxide or nitride), is exposed to an epitaxial process to form an epitaxial layer on the monocrystalline surface while forming limited or no polycrystalline layer on the secondary surfaces. According to one or more embodiments, the epitaxial process, which may also be referred to as the alternating gas supply (AGS) process includes repeating a cycle of a deposition process and an etching process until the desired thickness of an epitaxial layer is grown. An AGS process is described in copending and commonly signed U.S. patent application Ser. No. 11/001, 774, entitled Selective Epitaxy Process with Alternating Gas Supply and Published as U.S. Patent Application Publication US 2006/0115934. According to one or more embodiments, the alternating gas supply process may include repeating a cycle of a deposition process, an etching process, and a purge process until the desired thickness of the epitaxial layer is grown.

In one or more embodiments, the deposition process includes exposing the substrate surface to a deposition gas containing at least a silicon source. Typically, the deposition gas will also contain a carrier gas. In one or more embodiments, the deposition gas may also include a germanium source or carbon source, as well as a dopant source. During the deposition process, an epitaxial layer is formed on the monocrystalline surface of the substrate while a polycrystalline layer is formed on secondary surfaces, such as amorphous and/or polycrystalline surfaces. Subsequently, the substrate is exposed to an etching gas. The etching gas includes a carrier gas and an etchant, such as chlorine gas or hydrogen chloride. The etching gas removes silicon-containing materials deposited during the deposition process. According to certain embodiments, during the etching process, the polycrystalline layer is removed at a faster rate than the epitaxial layer. Therefore, the net result of the deposition and etching processes forms epitaxially grown silicon-containing material on monocrystalline surfaces while minimizing growth, if any, of polycrystalline silicon-containing material on the secondary surfaces. In one or more embodiments, the pressure within the processing chamber is adjusted between the deposition and etching steps so that the pressure higher during etching than during deposition. According to one or more embodiments, the increased pressure results in an increase in the substrate temperature. In other embodiments, the gas distribution to certain zones of the processing chamber may be adjusted and varied between the deposition of etching and deposition steps. A cycle of the deposition and etching processes may be repeated as needed to obtain the desired thickness of silicon-containing materials. The silicon-containing materials which can be deposited by embodiments of the invention include silicon, silicon germanium, silicon carbon, silicon germanium carbon, and dopant variants thereof.

In one embodiment of a process, use of chlorine gas as an etchant lowers the overall process temperature below about 800° C. In general, deposition processes may be conducted at lower temperatures than etching reactions, since etchants often need a high temperature to be activated. For example, silane may be thermally decomposed to deposit silicon at about 500° C. or less, while hydrogen chloride requires an activation temperature of about 700° C. or higher to act as an effective etchant. Therefore, if hydrogen chloride is used during the process, the overall process temperature is dictated by the higher temperature required to activate the etchant. Chlorine contributes to the overall process by reducing the required overall process temperature. Chlorine may be activated at a temperature as low as about 500° C. Therefore, by incorporating chlorine into the process as the etchant, the overall process temperature may be significantly reduced, such as by 200° C. to 300° C., over processes which use hydrogen chloride as the etchant. Also, chlorine etches silicon-containing materials faster than hydrogen chloride. Therefore, chlorine etchants increase the overall rate of the process.

The carrier gas can be any suitable inert gas or hydrogen. Although noble gasses, such as argon or helium, may be used as an inert carrier gas, according to certain embodiments, nitrogen is the economically preferred inert carrier gas. Nitrogen is generally much less expensive than hydrogen, argon or helium. One drawback that may occur from using nitrogen as a carrier gas is the nitridizing of materials on a substrate during deposition processes. However, high temperature, such as greater than 800° C., is required to activate nitrogen in such a manner. Therefore, in one or more embodiments, nitrogen may be used as an inert carrier gas in processes conducted at temperatures below the nitrogen activation threshold. The combined effect of using chlorine as an etchant and nitrogen as a carrier gas greatly increases the rate of the overall process.

Throughout the application, the terms "silicon-containing" materials, compounds, films or layers should be construed to include a composition containing at least silicon and may contain germanium, carbon, boron, arsenic, phosphorous gallium and/or aluminum. Other elements, such as metals, halogens or hydrogen may be incorporated within a silicon-containing material, compound, film or layer, usually in part per million (ppm) concentrations. Compounds or alloys of silicon-containing materials may be represented by an abbreviation, such as Si for silicon, SiGe, for silicon germanium, SiC for silicon carbon and SiGeC for silicon germanium carbon. The abbreviations do not represent chemical equations with stoichiometric relationships, nor represent any particular reduction/oxidation state of the silicon-containing materials.

According to one or more embodiments, the AGS process is modified to modulate different nucleation rates and mechanisms between on silicon crystal substrate and on dielectric film. According to embodiments of the invention, independent optimization of film growth reactions during deposition and film etching reactions and a series of alternating deposition and etching cycles are utilized to provide a high selective growth rate without losing selectivity. While the present invention should not be limited by a particular theory, in certain embodiments, silicon nuclei formation on the dielectric surface is suppressed below their critical sizes by modulating one or more of the deposition and etchant gases, gas flow distribution, substrate temperature, and reactor pressure in a cyclic deposition and etch to provide a selective process with a high deposition rate. In specific embodiments, during the film deposition step, the reactor pressure is kept relatively low, for example, by fully opening a pressure control valve and a silicon-containing source is introduced into the reactor without any etchant gas being introduced into the process chamber. It will be understood that the pressure can be reduced in the chamber by other means. According to one or more embodiments, the low-pressure deposition cycle maintains a low deposition partial pressure and decreases the wafer's temperature via heat conduction and therefore suppresses excessive film nucleation on the dielectric films.

In one or more embodiments, during the film etching step the reactor pressure is increased, for example, by fully closing the pressure control valve and the etch gas, for example, HCl, is introduced into the reactor, but no deposition gasses are flowed during etching. According to embodiments of the invention, this high-pressure etching cycle offers a high etchant partial pressure and increases the wafer's temperature via heat conduction and therefore enhances film etching efficiency. By optimizing the cycle times of the deposition and etching steps, it is possible to maintain a balance between epitaxial growth on silicon surfaces and no nucleation on dielectric films, which results in a high selective growth rate without losing selectivity.

An exemplary embodiment of an epitaxial process to deposit a silicon-containing layer includes loading a substrate, which is usually a patterned substrate, into a process chamber and adjusting the conditions within the process chamber to a desired temperature and pressure. According to one or more embodiments, the pressure in the process chamber is kept relatively low, for example, less than about 50 Torr. In a specific embodiment, the pressure is reduced below about 20 Torr. While the pressure is kept relatively low, a deposition process is initiated by flowing deposition gases such as a silicon source gas to form an epitaxial layer on a monocrystalline surface of the substrate while forming a polycrystalline layer on the amorphous and/or polycrystalline surfaces of the substrate.

In accordance with one or more embodiments, during deposition, the flow distribution in the process chamber is maintained so that a greater amount of deposition gas is flowed in a first zone, for example an inner radial zone than in a second zone, for example, an outer radial zone of the process chamber. The inner radial zone and outer radial zone of the process chamber are selected to coincide with the diameter of the substrate being processed. However, it will be understood, that the flow distribution of gas into the process chamber can be varied in other ways. In an exemplary embodiment, the inner radial zone may be a coaxial, central zone of the substrate having a diameter of about one-half the diameter of the substrate being processed. The outer radial zone would then comprise a region surrounding the inner radial zone. As an example, in a process chamber for processing circular substrates having a diameter of 300 mm, the inner zone could be a 75 mm central region of the substrate.

Referring now to FIG. 1, a schematic top plan view of a process chamber 100 containing a substrate 110 is shown. The process chamber includes a first or inner radial zone 112 and a second or outer radial zone 114 containing the substrate 110. A gas source 120 is in fluid communication with an inner zone gas conduit 122 and outer zone gas conduits 124, 126. The gas conduits 122, 124, and 126 may be connected to a distribution port 130 in fluid communication with the chamber. The distribution port 130 may be in communication with one or more inner zone ports 132, and two or more outer zone ports 134, 136. An inner zone metering valve 142 and an outer zone metering valve 144 respectively control that amount of process gas flowing to the inner radial zone 112 and outer radial zone 114. The metering valves 142 and 144 can be adjusted to reduce the diameter of the inner zone gas conduit 122 and outer zone gas conduit 124. By decreasing the diameter of a gas conduit, the amount of gas flowing to a zone can reduced, while increasing the diameter of a gas conduit, the amount of gas flowing to a zone can be increased. Such a gas distribution arrangement is available from the Epi Centura® including Accusett™ metering valves available from Applied Materials, Santa Clara, Calif. It will be understood that other ways of reducing the flow to the respective zones can be utilized. For example, instead of metering valves, the gas flow can be controlled by mass flow controllers or other suitable flow controllers to regulate the amount of gas flowing through the conduits. Furthermore, the flow distribution within the chamber can be varied in ways other than providing an inner radial zone and outer radial zone of flow.

The ratio of the amount of gas flowing to the inner radial zone 112 to the amount of gas flowing to the outer radial zone 114 may be represented by I/O, where I represents the amount of gas flowing to the inner radial zone 112 and O represents the amount of gas flowing to the outer radial zone. In one or more embodiments, during deposition, the ratio I/O is less than about one. According to certain embodiments, the ratio I/O is between about 0.2 and 1.0, and in a specific embodiment, between about 0.4 and 0.8.

The deposition process is then terminated, and according to one or more embodiments, the pressure in the process chamber is ramped up or increased to a higher pressure, for example, greater than about 50 Torr. According to one or more embodiments, the pressure can be ramped up to about 100 Torr or higher, for example, about 300 Torr. According to certain embodiments, an increase in pressure in the process chamber results in an increased substrate temperature, without a change in the temperature setpoint in the substrate processing apparatus. In other words, the temperature of the substrate can be changed without changing the power supplied to the substrate heating elements, which are typically heating lamps. Etchant gas is then flowed into the process chamber to the inner and outer radial zones. According to one or more embodiments, no deposition gas is flowed while etchant gas is flowing into the process chamber. In one embodiment of the invention, the flow distribution of the inner radial zone and outer radial zone is adjusted so that the flow to the inner radial zone is greater than the flow to the outer radial zone. According to one or more embodiments, the ratio I/O during etching is greater than about one, for example between about 1.0 and 6.0, more specifically, between about 1.0 and 3.0. Preferably, the polycrystalline layer is etched at a faster rate than the epitaxial layer. The etching step either minimizes or completely removes the polycrystalline layer while removing only a marginal portion of the epitaxial layer. The etching process is then terminated. The thickness of the epitaxial layer and the polycrystalline layer can then be determined by measuring the thickness. If the predetermined thickness of the epitaxial layer or the polycrystalline layer is achieved, then epitaxial process is terminated. However, if the predetermined thickness is not achieved, then the steps of deposition and etching are repeated as a cycle until the predetermined thickness is achieved.

The sequence of a deposition step and an etching step may further include a step of purging the process chamber. After the purge, the thickness of the epitaxial layer can be determined, and if necessary, the sequence of deposition, etching, and an optional purge step may be repeated. During the purge step, the pressure in the process chamber is reduced below the pressure maintained in the chamber during etching and according to some embodiments, the pressure may be reduced to the same pressure as during the deposition. According to one or more embodiments, a decrease in pressure in the process chamber results in a rapid decrease in substrate temperature. Thus, the substrate temperature can be controlled by modulating the temperature in the process chamber without supplying additional power to the heating lamps of the process chamber. In addition, during purging, the ratio I/O may be adjusted such that a greater amount of purge gas flows to the outer radial zone than the inner radial zone.

Further exemplary details of a process sequence will now be described. The substrates loaded into the process chamber are typically patterned substrates. Patterned substrates are substrates that include electronic features formed into or onto the substrate surface. The patterned substrate usually contains monocrystalline surfaces and at least one secondary surface that is non-monocrystalline, such as polycrystalline or amorphous surfaces. Monocrystalline surfaces include the bare crystalline substrate or a deposited single crystal layer usually made from a material such as silicon, silicon germanium or silicon carbon. Polycrystalline or amorphous surfaces may include dielectric materials, such as oxides or nitrides, specifically silicon oxide or silicon nitride, as well as amorphous silicon surfaces.

Epitaxial process begins by adjusting the process chamber containing the patterned substrate to a predetermined temperature and pressure during step deposition as described above. The temperature is tailored to the particular conducted process. In prior processes, the process chamber is maintained at a consistent pressure, temperature and flow distribution throughout epitaxial process. However, according to embodiments of the invention, the temperature may be varied among the deposition, etch and purge steps. In one embodiment, temperature is raised during the etching step. During deposition, the process chamber is kept at a temperature in the range from about 250° C. to about 1000° C., specifically from about 500° C. to about 800° C. and more specifically from about 550° C. to about 750° C. The appropriate temperature to conduct epitaxial process may depend on the particular precursors used to deposit and/or etch the silicon-containing materials. In one example, it has been found that chlorine ($Cl_2$) gas works exceptionally well as an etchant for silicon-containing materials at temperatures lower than processes using more common etchants. Therefore, in one embodiment, a suitable temperature to pre-heat the process chamber is about 750° C. or less, specifically about 650° C. or less and more specifically about 550° C. or less. During deposition, the process chamber is usually maintained at a pressure from about 1 Torr to about 50 Torr.

During the deposition process the patterned substrate is exposed to a deposition gas to form an epitaxial layer on the monocrystalline surface while forming a polycrystalline layer on the secondary surfaces. The substrate is exposed to the deposition gas for a period of time of about 0.5 seconds to about 30 seconds, for example from about 1 second to about 20 seconds, and more specifically from about 5 seconds to about 10 seconds. The specific exposure time of the deposition process is determined in relation to the exposure time during the etching process, as well as particular precursors and temperature used in the process. Generally, the substrate is exposed to the deposition gas long enough to form a maximized thickness of an epitaxial layer while forming a minimal thickness of a polycrystalline layer that may be easily etched away.

The deposition gas contains at least a silicon source and a carrier gas, and may contain at least one secondary elemental source, such as a germanium source and/or a carbon source. Also, the deposition gas may further include a dopant compound to provide a source of a dopant, such as boron, arsenic, phosphorous, gallium and/or aluminum.

The silicon source is usually provided into the process chamber at a rate in a range from about 5 sccm to about 500 sccm, for example, from about 10 sccm to about 300 sccm, and more specifically from about 50 sccm to about 200 sccm, for example, about 50 sccm. Silicon sources useful in the deposition gas to deposit silicon-containing compounds include silanes, halogenated silanes and organosilanes. Silicon sources useful in the deposition gas to deposit silicon-containing compounds include silanes, halogenated silanes and organosilanes. Silanes include silane ($SiH_4$) and higher silanes with the empirical formula $Si_xH_{(2x+2)}$, such as disilane ($Si_2H_6$), trisilane ($Si_3H_8$), and tetrasilane ($Si_4H_{10}$), as well as others. Halogenated silanes include compounds with the empirical formula $X'_ySi_xH_{(2x+2-y)}$, where X'=F, Cl, Br or I, such as hexachlorodisilane ($Si_2Cl_6$), tetrachlorosilane ($SiCl_4$), dichlorosilane ($Cl_2SiH_2$) and trichlorosilane ($Cl_3SiH$). Organosilanes include compounds with the empirical formula $R_ySi_xH_{(2x+2-y)}$, where R=methyl, ethyl, propyl or butyl, such as methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$) and hexamethyldisilane (($CH_3$)$_6Si_2$). Organosilane compounds have been found to be advantageous silicon sources as well as carbon sources in embodiments which incorporate carbon in the deposited silicon-containing compound.

The silicon source is usually provided into the process chamber along with a carrier gas. The carrier gas has a flow rate from about 1 slm (standard liters per minute) to about 100 slm, for example from about 5 slm to about 75 slm, and more specifically from about 10 slm to about 50 slm, for example, about 25 slm. Carrier gases may include nitrogen ($N_2$), hydrogen ($H_2$), argon, helium and combinations thereof. An inert carrier gas is preferred and includes nitrogen, argon, helium and combinations thereof. A carrier gas may be selected based on the precursor(s) used and/or the process temperature during the epitaxial process. The carrier gas may be the same throughout each of the steps of deposition and etch. However, some embodiments may use different carrier gases in particular steps. For example, nitrogen may be used as a carrier gas with the silicon source during deposition and with the etchant during etchant.

Nitrogen may be utilized as a carrier gas in embodiments featuring low temperature (e.g., <800° C.) processes. Low temperature processes are accessible due in part to the use of chlorine gas in the etching process. Nitrogen remains inert during low temperature deposition processes. Therefore, nitrogen is not incorporated into the deposited silicon-containing material during low temperature processes. Finally, the low temperature processes may take economic advantage of nitrogen as a carrier gas, since nitrogen is far less expensive than hydrogen, argon or helium. Although nitrogen has several advantages, the invention is not limited to the use of nitrogen as a carrier gas, and other suitable carrier gases such as hydrogen and noble gasses may be used.

The deposition gas may also contain at least one secondary elemental source, such as a germanium source and/or a carbon source. The germanium source may be added to the process chamber with the silicon source and carrier gas to form a silicon-containing compound, such as a silicon germanium material. The germanium source is usually provided into the process chamber at a rate in the range from about 0.1 sccm to about 20 sccm, for example, from about 0.5 sccm to about 10 sccm, and more specifically from about 1 sccm to about 5 sccm, for example, about 2 sccm. Germanium sources useful to deposit silicon-containing compounds include germane ($GeH_4$), higher germanes and organogermanes. Higher germanes include compounds with the empirical formula $Ge_xH_{(2x+2)}$, such as digermane ($Ge_2H_6$), trigermane ($Ge_3H_8$) and tetragermane ($Ge_4H_{10}$), as well as others. Organogermanes include compounds such as methylgermane (($CH_3$)$GeH_3$), dimethylgermane (($CH_3$)$_2GeH_2$), ethylgermane (($CH_3CH_2$)$GeH_3$), methyldigermane (($CH_3$)$Ge_2H_5$), dimethyldigermane (($CH_3$)$_2Ge_2H_4$) and hexamethyldigermane (($CH_3$)$_6Ge_2$). Germanes and organogermane compounds have been found to be advantageous germanium sources and carbon sources in embodiments while incorporating germanium and carbon into the deposited silicon-containing compounds, namely SiGe and SiGeC compounds. The germanium concentration in the epitaxial layer is in the range from about 1 atomic % to about 30 atomic %, for example, about 20 atomic %. The germanium concentration may be graded within an epitaxial layer, preferably graded with a higher germanium concentration in the lower portion of the epitaxial layer than in the upper portion of the epitaxial layer.

Alternatively, a carbon source may be added deposition to the process chamber with the silicon source and carrier gas to form a silicon-containing compound, such as a silicon carbon material. A carbon source is usually provided into the process chamber at a rate in the range from about 0.1 sccm to about 20 sccm, for example, from about 0.5 sccm to about 10 sccm, and more specifically from about 1 scorn to about 5 sccm, for example, about 2 sccm. Carbon sources useful to deposit silicon-containing compounds include organosilanes, alkyls, alkenes and alkynes of ethyl, propyl and butyl. Such carbon sources include methylsilane ($CH_3SiH_3$), dimethylsilane (($CH_3$)$_2SiH_2$), ethylsilane ($CH_3CH_2SiH_3$), methane ($CH_4$), ethylene ($C_2H4$), ethyne ($C_2H_2$), propane ($C_3H_8$), propene ($C_3H_6$), butyne ($C_4H_6$), as well as others. The carbon concentration of an epitaxial layer is in the range from about 200 ppm to about 5 at %, for example, from about 1 at % to about 3 at %, for example 1.5 at %. In one embodiment, the carbon concentration may be graded within an epitaxial layer, preferably graded with a lower carbon concentration in the initial portion of the epitaxial layer than in the final portion of the epitaxial layer. Alternatively, a germanium source and a carbon source may both be added during deposition into the process chamber with the silicon source and carrier gas to form a silicon-containing compound, such as a silicon carbon or silicon germanium carbon material.

The deposition gas used may further include at least one dopant compound to provide a source of elemental dopant, such as boron, arsenic, phosphorous, gallium or aluminum. Dopants provide the deposited silicon-containing compounds with various conductive characteristics, such as directional electron flow in a controlled and desired pathway required by the electronic device. Films of the silicon-containing compounds are doped with particular dopants to achieve the desired conductive characteristic. In one example, the silicon-containing compound is doped p-type, such as by using diborane to add boron at a concentration in the range from about $10^{15}$ atoms/cm$^3$ to about $10^{21}$ atoms/cm$^3$. In one example, the p-type dopant has a concentration of at least $5 \times 10^{19}$ atoms/cm$^3$. In another example, the p-type dopant is in the range from about $1 \times 10^{20}$ atoms/cm$^3$ to about $2.5 \times 10^{21}$ atoms/cm$^3$. In another example, the silicon-containing compound is doped n-type, such as with phosphorous and/or arsenic to a concentration in the range from about $10^{15}$ atoms/cm$^3$ to about $10^{21}$ atoms/cm$^3$.

A dopant source is usually provided into the process chamber during deposition at a rate in the range from about 0.1 sccm to about 20 sccm, for example, from about 0.5 sccm to about 10 sccm, and more specifically from about 1 sccm to about 5 sccm, for example, about 2 sccm. Boron-containing dopants useful as a dopant source include boranes and organoboranes. Boranes include borane, diborane ($B_2H_6$), triborane, tetraborane and pentaborane, while alkylboranes include compounds with the empirical formula $R_xBH_{(3-x)}$, where R=methyl, ethyl, propyl or butyl and x=1, 2 or 3. Alkylboranes include trimethylborane (($CH_3$)$_3$B), dimethylborane (($CH_3$)$_2$BH), triethylborane (($CH_3CH_2$)$_3$B) and diethylborane (($CH_3CH_2$)$_2$BH). Dopants may also include arsine ($AsH_3$), phosphine ($PH_3$) and alkylphosphines, such as with the empirical formula $R_xPH_{(3-x)}$, where R=methyl, ethyl, propyl or butyl and x=1, 2 or 3. Alkylphosphines include trimethylphosphine (($CH_3$)$_3$P), dimethylphosphine (($CH_3$)$_2$PH), triethylphosphine (($CH_3CH_2$)$_3$P) and diethylphosphine (($CH_3CH_2$)$_2$PH). Aluminum and gallium dopant sources may include alkylated and/or halogenated derivates, such as described with the empirical formula $R_xMX_{(3-x)}$, where M=Al or Ga, R=methyl, ethyl, propyl or butyl, X=Cl or F and x=0, 1, 2 or 3. Examples of aluminum and gallium dopant sources include trimethylaluminum ($Me_3Al$), triethylaluminum ($Et_3Al$), dimethylaluminumchloride ($Me_2AlCl$), aluminum chloride ($AlCl_3$), trimethylgallium ($Me_3Ga$), triethylgallium ($Et_3Ga$), dimethylgalliumchloride ($Me_2GaCl$) and gallium chloride ($GaCl_3$).

After the deposition process is terminated, in one example, the process chamber may be flushed with a purge gas or the carrier gas and/or the process chamber may be evacuated with a vacuum pump. The purging and/or evacuating processes remove excess deposition gas, reaction by-products and other contaminates. In another example, once the deposition process has terminated, the etching process is immediately started without purging and/or evacuating the process chamber.

The etching process removes silicon-containing materials from the substrate surface deposited during deposition. The etching process removes both epitaxial or monocrystalline materials and amorphous or polycrystalline materials. Polycrystalline layers, if any, deposited on the substrate surface are removed at a faster rate than the epitaxial layers. The time duration of the etching process is balanced with the time duration of the deposition process to result in net deposition of the epitaxial layer selectively formed on desired areas of the substrate. Therefore, the net result of the deposition process and etching process is to form selective and epitaxially grown silicon-containing material while minimizing, if any, growth of polycrystalline silicon-containing material.

During etching, the substrate is exposed to the etching gas for a period of time in the range from about 10 seconds to about 90 seconds, for example, from about 20 seconds to about 60 seconds, and more specifically from about 30 seconds to about 45 seconds. The etching gas includes at least one etchant and a carrier gas. The etchant is usually provided into the process chamber at a rate in the range from about 10 sccm to about 700 sccm, for example, from about 50 sccm to about 500 sccm, and more specifically from about 100 sccm to about 400 sccm, for example, about 200 sccm. The etchant used in the etching gas may include chlorine ($Cl_2$), hydrogen chloride (HCl), boron trichloride ($BCl_3$), carbon tetrachloride ($CCl_4$), chlorotrifluoride ($ClF_3$) and combinations thereof.

The etchant is usually provided into the process chamber with a carrier gas. The carrier gas has a flow rate in the range from about 1 slm to about 100 slm, for example from about 5 slm to about 75 slm, and more specifically from about 10 slm to about 50 slm, for example, about 25 slm. Carrier gases may include nitrogen ($N_2$), hydrogen ($H_2$), argon, helium and combinations thereof. In some embodiments, an inert carrier gas is used and includes nitrogen, argon, helium and combinations thereof. A carrier gas may be selected based upon specific precursor(s) and/or temperature used during the epitaxial process.

After termination of the etching process, in one embodiment, the process chamber may be flushed with a purge gas or the carrier gas and/or the process chamber may be evacuated with a vacuum pump. The purging and/or evacuating processes remove excess etching gas, reaction by-products and other contaminates. In another example, once the etching process has terminated, no purge process is used. The pressure in the process chamber may be lowered to less than about 50 Torr, for example to about 10 Torr during purging, and the gas flow distribution may be adjusted.

The thicknesses of the epitaxial layer and the polycrystalline layer may be determined after performance of one or more cycles of deposition, etch, and an optional purge step. If the predetermined thicknesses are achieved, then epitaxial process can be terminated. However, if the predetermined thicknesses are not achieved, the deposition and etching are repeated as a cycle until the desired thicknesses are achieved. The epitaxial layer is usually grown to have a thickness at a range from about 10 Angstroms to about 2000 Angstroms, specifically from about 100 Angstroms to about 1500 Angstroms, and more specifically from about 400 Angstroms to about 1200 Angstroms, for example, about 800 Angstroms. The polycrystalline layer is usually deposited with a thickness, if any, in a range from an atomic layer to about 500 Angstroms. The desired or predetermined thickness of the epitaxial silicon-containing layer or the polycrystalline silicon-containing layer is specific to a particular fabrication process. In one example, the epitaxial layer may reach the predetermined thickness while the polycrystalline layer is too thick. The excess polycrystalline layer may be further etched.

Figure 2A:
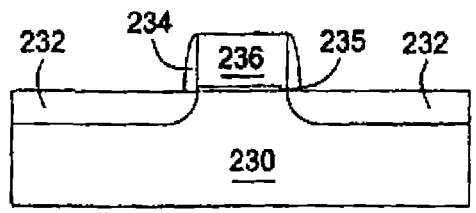
FIGS. 2A-2E show schematic illustrations of fabrication techniques for a source/drain extension device within a MOSFET.
Figure 2B:
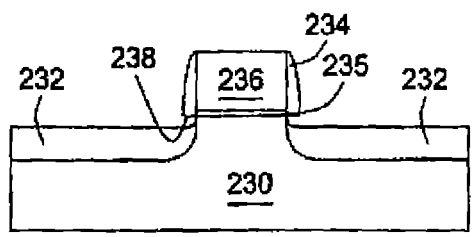

In one example, as depicted in FIGS. 2A-2E, a source/drain extension is formed within a MOSFET device wherein the silicon-containing layers are epitaxially and selectively deposited on the surface of the substrate. FIG. 2A depicts a source/drain region 232 formed by implanting ions into the surface of a substrate 230. The segments of source/drain region 232 are bridged by the gate 236 formed on gate oxide layer 235 and spacer 234. In order to form a source/drain extension, a portion of the source/drain region 232 is etched and wet-cleaned to produce a recess 238, as in FIG. 2B. Etching of the gate 236 may be avoided by depositing a hard mask prior to etching the portion of source/drain region 232.

Figure 2C:
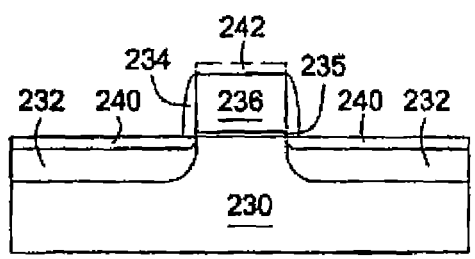

FIG. 2C illustrates one embodiment of an epitaxial process described herein, in which a silicon-containing epitaxial layer 240 and optional polycrystalline layer 242 are simultaneously and selectively deposited without depositing on the spacer 234. Polycrystalline layer 242 is optionally formed on gate 236 by adjusting the deposition and etching processes. Alternatively, polycrystalline layer 242 is continually etched away from gate 236 as epitaxial layer 240 is deposited on the source/drain region 232.

In another example, silicon-containing epitaxial layer 240 and polycrystalline layer 242 are SiGe-containing layers with a germanium concentration in a range from about 1 at % to about 50 at %, for example, about 24 at % or less. Multiple SiGe-containing layers containing varying amounts of silicon and germanium may be stacked to form silicon-containing epitaxial layer 240 with a graded elemental concentration. For example, a first SiGe-layer may be deposited with a germanium concentration in a range from about 15 at % to about 25 at % and a second SiGe-layer may be deposited with a germanium concentration in a range from about 25 at % to about 35 at %.

In another example, silicon-containing epitaxial layer 240 and polycrystalline layer 242 are SiC-containing layers with a carbon concentration in a range from about 200 ppm to about 5 at %, specifically about 3 at % or less, more specifically, from about 1 at % to about 2 at %, for example, about 1.5 at %. In another embodiment, silicon-containing epitaxial layer 240 and polycrystalline layer 242 are SiGeC-containing layers with a germanium concentration in the range from about 1 at % to about 50 at %, specifically about 24 at % or less and a carbon concentration at about 200 ppm to about 5 at %, specifically about 3 at % or less, more specifically from about 1 at % to about 2 at %, for example, about 1.5 at %.

Multiple layers containing Si, SiGe, SiC or SiGeC may be deposited in varying order to form graded elemental concentrations within the silicon-containing epitaxial layer 240. The silicon-containing layers are generally doped with a dopant (e.g., boron, arsenic, phosphoric, gallium or aluminum) having a concentration in the range from about $1 \times 10^{19}$ atoms/cm$^3$ to about $2.5 \times 10^{21}$ atoms/cm$^3$, specifically from about $5 \times 10^{19}$ atoms/cm$^3$ to about $2 \times 10^{20}$ atoms/cm$^3$. Dopants added to individual layers of the silicon-containing material form graded dopants. For example, silicon-containing epitaxial layer 240 is formed by depositing a first SiGe-containing layer with a dopant concentration (e.g., boron) in a range from about $5 \times 10^{19}$ atoms/cm$^3$ to about $1 \times 10^{20}$ atoms/cm$^3$ and a second SiGe-containing layer with a dopant concentration (e.g., boron) in a range from about $1 \times 10^{20}$ atoms/cm$^3$ to about $2 \times 10^{20}$ atoms/cm$^3$.

Carbon incorporated in SiC-containing layers and SiGeC-containing layers is generally located in interstitial sites of the crystalline lattice immediately following the deposition of the silicon-containing layer. The interstitial carbon content is about 10 at % or less, for example, less than about 5 at % and more specifically from about 1 at % to about 3 at %, for example, about 2 at %. The silicon-containing epitaxial layer 240 may be annealed to incorporate at least a portion, if not all of the interstitial carbon into substitutional sites of the crystalline lattice. The annealing process may include a spike anneal, such as rapid thermal process (RTP), laser annealing or thermal annealing with an atmosphere of gas, such as oxygen, nitrogen, hydrogen, argon, helium or combinations thereof. The annealing process may occur immediately after the silicon-containing layer is deposited or after a variety of other process steps the substrate will endure.

Figure 2D:
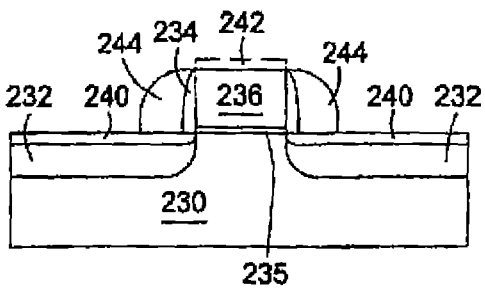

During the next step, FIG. 2D shows a spacer 244, generally a nitride spacer (e.g., Si$_3$N$_4$) deposited on the spacer 234. Spacer 244 is usually deposited in a different chamber by a CVD or ALD technique. Therefore, the substrate is removed from the process chamber that was used to deposit silicon-containing epitaxial layer 240. During the transfer between the two chambers, the substrate may be exposed to ambient conditions, such as the temperature, pressure or the atmospheric air containing water and oxygen. Upon depositing the spacer 244, or performing other semiconductor process (e.g., anneal, deposition or implant), the substrate may be exposed to ambient conditions a second time prior to depositing elevated layer 248. In one embodiment, an epitaxial layer (not shown) with no or minimal germanium (e.g., less than about 5 at %) is deposited on the top of epitaxial layer 240 before exposing the substrate to ambient conditions since native oxides are easier to remove from epitaxial layers containing minimal germanium concentrations than from an epitaxial layer formed with a germanium concentration greater than about 5 at %.

Figure 2E:
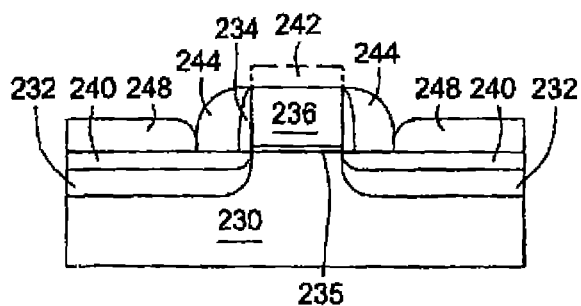

FIG. 2E depicts another example in which an elevated layer 248 comprised of a silicon-containing material is selectively and epitaxially deposited on epitaxial layer 240 (e.g., doped-SiGe). During the deposition process, polycrystalline layer 242 is further grown, deposited or etched away on the gate 236.

In one embodiment, elevated layer 248 is epitaxial deposited silicon containing little or no germanium or carbon. However, in an alternative embodiment, elevated layer 248 does contain germanium and/or carbon. For example, elevated layer 248 may have about 5 at % or less of germanium. In another example, elevated layer 248 may have about 2 at % or less of carbon. Elevated layer 248 may also be doped with a dopant, such as boron, arsenic, phosphorous, aluminum or gallium.

Silicon-containing compounds are utilized within embodiments of the processes to deposit silicon-containing layers used for Bipolar device fabrication (e.g., base, emitter, collector, emitter contact), BiCMOS device fabrication (e.g., base, emitter, collector, emitter contact) and CMOS device fabrication (e.g., channel, source/drain, source/drain extension, elevated source/drain, substrate, strained silicon, silicon on insulator and contact plug). Other embodiments of processes teach the growth of silicon-containing layers that can be used as gate, base contact, collector contact, emitter contact, elevated source/drain and other uses.

Figure 3A:
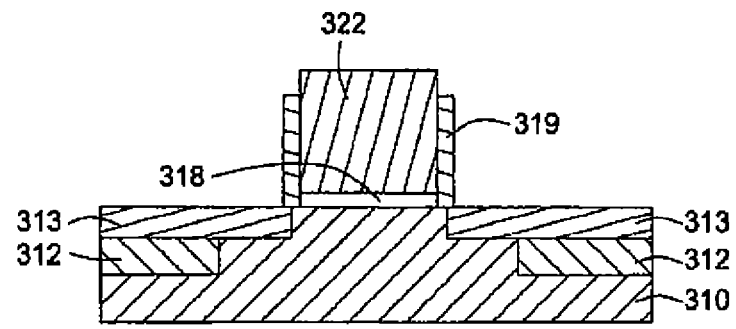
FIGS. 3A-C show several devices containing selectively and epitaxially deposited silicon-containing layers by applying embodiments described herein.
Figure 3B:
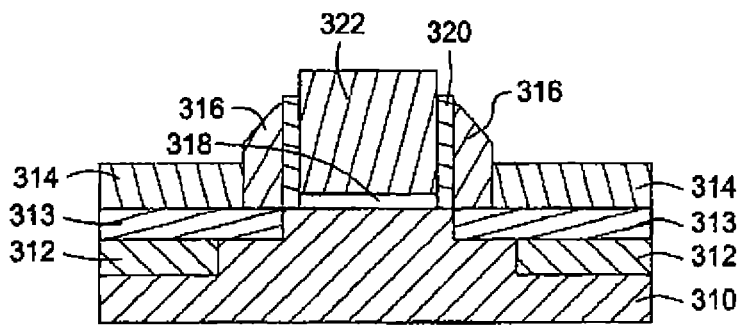
Figure 3C:
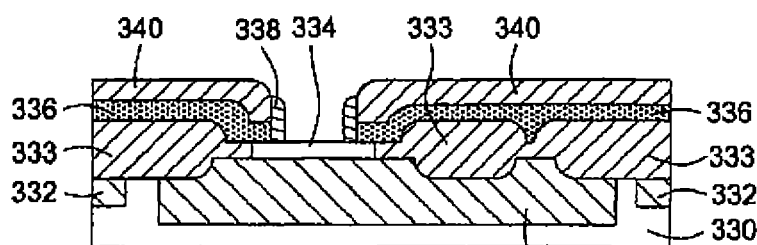

The processes are extremely useful for depositing selective, epitaxial silicon-containing layers in MOSFET and bipolar transistors as depicted in FIGS. 3A-3C. FIGS. 3A-3B show the epitaxially grown silicon-containing compounds on a MOSFET device. The silicon-containing compound is deposited on the source/drain features of the device. The silicon-containing compound adheres and grows from the crystal lattice of the underlying layer and maintains this arrangement as the silicon-containing compound is grown to a desired thickness. FIG. 3A demonstrates the silicon-containing compound deposited as a recessed source/drain layer, while FIG. 3B shows silicon-containing compounds deposited as recessed source/drain layer and an elevated source/drain layer.

The source/drain region 312 is formed by ion implantation. Generally, the substrate 310 is doped n-type while the source/drain region 312 is doped p-type. Silicon-containing epitaxial layer 313 is selectively grown on the source/drain region 312 and/or directly on substrate 310. Silicon-containing epitaxial layer 314 is selectively grown on the silicon-containing layer 313 according to aspects herein. A gate oxide layer 318 bridges the segmented silicon-containing layer 313. Generally, gate oxide layer 318 is composed of silicon dioxide, silicon oxynitride or hafnium oxide. Partially encompassing the gate oxide layer 318 is a spacer 316, which is usually an isolation material such as a nitride/oxide stack (e.g., $Si_3N_4$/$SiO_2$/$Si_3N_4$). Gate layer 322 (e.g., polysilicon) may have a protective layer 319, such as silicon dioxide, along the perpendicular sides, as in FIG. 3A. Alternately, gate layer 322 may have a spacer 316 and off-set layers 320 (e.g., $Si_3N_4$) disposed on either side.

In another example, FIG. 3C depicts the deposited silicon-containing epitaxial layer 334 as a base layer of a bipolar transistor. Silicon-containing epitaxial layer 334 is selectively grown with the various embodiments of the invention. Silicon-containing epitaxial layer 334 is deposited on an n-type collector layer 332 previously deposited on substrate 330. The transistor further includes isolation layer 333 (e.g., $SiO_2$ or $Si_3N_4$), contact layer 336 (e.g., heavily doped poly-Si), off-set layer 338 (e.g., $Si_3N_4$), and a second isolation layer 340 (e.g., $SiO_2$ or $Si_3N_4$).

Embodiments of the invention teach processes to deposit silicon-containing compounds on a variety of substrates. Substrates on which embodiments of the invention may be useful include, but are not limited to semiconductor wafers, such as crystalline silicon (e.g., Si<100> and Si<111>), silicon oxide, silicon germanium, doped or undoped wafers and patterned or non-patterned wafers. Substrates have a variety of geometries (e.g., round, square and rectangular) and sizes (e.g., 200 mm OD, 300 mm OD).

In one embodiment, silicon-containing compounds deposited by process described herein include a germanium concentration within the range from about 0 atomic percent to about 95 at %. In another embodiment, a germanium concentration is within the range from about 1 at % to about 30 at %, preferably from about 15 at % to about 30 at %, for example, about 20 at %. Silicon-containing compounds also include a carbon concentration within the range from about 0 at % to about 5 at %. In other aspects, a carbon concentration is within the range from about 200 ppm to about 3 at %, preferably about 1.5 at %.

The silicon-containing compound films of germanium and/or carbon are produced by various processes of the invention and can have consistent, sporadic or graded elemental concentrations. Graded silicon germanium films are disclosed in U.S. Pat. No. 6,770,134 and U.S. patent application Ser. No. 10/014,466, published as U.S. Patent Publication 20020174827, both assigned to Applied Materials, Inc., and are incorporated herein by reference in entirety for the purpose of describing methods of depositing graded silicon-containing compound films. In one example, a silicon source (e.g., $SiH_4$) and a germanium source (e.g., $GeH_4$) are used to selectively and epitaxially deposit silicon germanium containing films. In this example, the ratio of silicon source and germanium source can be varied in order to provide control of the elemental concentrations, such as silicon and germanium, while growing graded films. In another example, a silicon source and a carbon source (e.g., $CH_3SiH_3$) are used to selectively and epitaxially deposit silicon carbon containing films. The ratio of silicon source and carbon source can be varied in order to provide control of the elemental concentration while growing homogenous or graded films. In another example, a silicon source, a germanium source and a carbon source are used to selectively and epitaxially deposit silicon germanium carbon containing films. The ratios of silicon, germanium and carbon sources are independently varied in order to provide control of the elemental concentration while growing homogenous or graded films.

MOSFET devices formed by processes described herein may contain a PMOS component or a NMOS component. The PMOS component, with a p-type channel, has holes that are responsible for channel conduction, while the NMOS component, with a n-type channel, has electrons that are responsible channel conduction. Therefore, for example, a silicon-containing material such as SiGe may be deposited in a recessed area to form a PMOS component. In another example, a silicon-containing film such as SiC may be deposited in a recessed area to form a NMOS component. SiGe is used for PMOS application for several reasons. A SiGe material incorporates more boron than silicon alone, thus the junction resistivity may be lowered. Also, the SiGe/silicide layer interface at the substrate surface has a lower Schottky barrier than the Si/silicide interface.

Further, SiGe grown epitaxially on the top of silicon has compressive stress inside the film because the lattice constant of SiGe is larger than that of silicon. The compressive stress is transferred in the lateral dimension to create compressive strain in the PMOS channel and to increase mobility of the holes. For NMOS application, SiC can be used in the recessed areas to create tensile stress in the channel, since the lattice constant of SiC is smaller than that of silicon. The tensile stress is transferred into the channel and increases the electron mobility. Therefore, in one embodiment, a first silicon-containing layer is formed with a first lattice strain value and a second silicon-containing layer is formed with a second lattice strain value. For example, a SiC layer with a thickness from about 50 Angstroms to about 200 Angstroms is deposited on the substrate surface and sequentially, a SiGe layer with a thickness from about 150 Angstroms to about 1,000 Angstroms is deposited on the SiC layer. The SiC layer may be epitaxially grown and has less strain than the SiGe layer epitaxially grown on the SiC layer.

In embodiments described herein, silicon-containing compound films are selectively and epitaxially deposited by chemical vapor deposition (CVD) processes. Chemical vapor deposition processes include atomic layer deposition (ALD) processes and/or atomic layer epitaxy (ALE) processes. Chemical vapor deposition includes the use of many techniques, such as plasma-assisted CVD (PA-CVD), atomic layer CVD (ALCVD), organometallic or metallorganic CVD (OMCVD or MOCVD), laser-assisted CVD (LA-CVD), ultraviolet CVD (UV-CVD), hot-wire (HWCVD), reduced-pressure CVD (RP-CVD), ultra-high vacuum CVD (UHV-CVD) and others. In one embodiment, the preferred process is to use thermal CVD to epitaxially grow or deposit the silicon-containing compound, whereas the silicon-containing compound includes silicon, SiGe, SiC, SiGeC, doped variants thereof and combinations thereof.

The processes of the invention can be carried out in equipment known in the art of ALE, CVD and ALD. The apparatus may contain multiple gas lines to maintain the deposition gas and the etching gas separated prior to entering the process chamber. Thereafter, the gases are brought into contact with a heated substrate on which the silicon-containing compound films are grown. Hardware that can be used to deposit silicon-containing films includes the Epi Centura.®. system and the Poly Gen®. system available from Applied Materials, Inc., located in Santa Clara, Calif. An ALD apparatus is disclosed in U.S. patent Ser. No. 10/032,284, filed Dec. 21, 2001, published as U.S. Patent Publication No. 20030079686, assigned to Applied Materials, Inc., and entitled, "Gas Delivery Apparatus and Methods for ALD," and is incorporated herein by reference in entirety for the purpose of describing the apparatus. Other apparatuses include batch, high-temperature furnaces, as known in the art.

Without intending to limit the invention in any manner, the present invention will be more fully described by the following examples.

EXAMPLES

Example 1

Selective epitaxy of silicon and SiGe onto two types of patterned substrates, substrates having a recessed structure and substrates not having a recessed structure. Each type of substrate was inserted into an EPI Centura RP processing chamber with Accusett™ metering valves. A layer of SiGe was selectively deposited to serve as a "marker layer" for the subsequent selective silicon deposition using a conventional co-flow process. The process conditions for the silicon deposition were as follows: the deposition pressure was 10 Torr, and silane was flowed at 50 sccm while dichlorosilane was flowed at 15 sccm, with hydrogen carrier gas flowing at 5 SLM. The ratio of I/O as defined above as set to 100/250 using the metering valves. Deposition was conducted for 5 seconds at 750° C. An etching step was performed. The process chamber pressure was increased to about 100 Torr, and HCl etchant was flowed at 650 sccm with hydrogen carrier gas at 5 SLM, the gas flowing at an I/O ratio of 250/100 for 6.5 seconds at 760° C. The process chamber was then purged by reducing the pressure to 10 Torr for 10 seconds at 750° C., with hydrogen purge gas flowing at an I/O ratio of 100/250. Such sequence of deposition, etching, and purging was repeated 17 times.

A selective silicon film was successfully grown with smooth morphology and free of faceting at a rate of 74 Angstroms/minute on the portion of the substrate having a low density pattern of recesses. Using the same process, a growth rate of 91 Angstroms per minute was achieved on the areas of the substrate having a high density pattern of recesses. These growth rates and film quality are comparable to results achieved at temperatures of 800° C. using the conventional approach of simultaneously flowing etching gas and deposition gas. Control of the process parameters resulted in an increased growth rate at a lower process pressure.

Example 2

The processing conditions in Example 1 were repeated on a substrate having a high density of recesses. During deposition, the pressure in the processing chamber was maintained at 5 Torr, and during etching, the pressure was increased to about 70 Torr. During purge, the pressure was reduced to 5 Torr. The growth rate achieved in this example exceeded 100 Angstroms per minute, but an examination of the films using microscopy revealed that the films revealed a minor faceting profile at the corners.

Example 3

The processing conditions in Example 2 were repeated on a substrate that did not have a recessed pattern structure, but in this example, nitrogen was used as the carrier gas and the temperature was reduced to about 700° C. The growth rate acbhieved was 35 Angstroms/minute and is approximately twice the growth rate of about 12-15 Angstroms/minute observed using the conventional approach of simultaneously flowing the etching and deposition gases into the process chamber.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments. The order of description of the above method should not be considered limiting, and methods may use the described operations out of order or with omissions or additions.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method of selectively and epitaxially forming a silicon containing material on a substrate surface comprising:
   a) placing a substrate comprising a monocrystalline surface and at least a dielectric surface into a process chamber, the process chamber including a first radial zone and a second radial zone containing the substrate, each of said radial zones in separate fluid communication with a gas source for differentially controlling gas flow to the first radial zone and second radial zone of the substrate to provide a gas flow ratio of the first radial zone to the second radial zone, the first radial zone including an inner radial zone and the second radial zone including an outer radial zone;
   b) exposing the substrate to a gas consisting essentially of a deposition gas comprising a silicon-containing deposition gas and maintaining the pressure in the process chamber below about 50 Torr to form an epitaxial layer on the monocrystalline surface and a second material on the dielectric surface, the gas being flowed in a manner to provide a ratio of inner radial zone gas flow to outer radial zone gas flow (I/O) less than one; and
   c) subsequently stopping the flow of deposition gas to the process chamber, increasing the pressure in the process chamber and exposing the substrate to an etchant gas to maintain a relatively high etchant gas partial pressure and to etch the second material, the etchant gas flowed in a manner to provide an I/O greater than one;
   d) subsequently stopping the flow of etchant gas to the process chamber and flowing a purge gas into the process chamber; and
   e) sequentially repeating steps b), c) and d) at least once.

2. The method of claim 1, wherein no etchant gas is flowed into the process chamber while the deposition gas is flowing into the process chamber.

3. The method of claim 1, wherein the I/O is between about 0.2 and 1.0 during exposure of the substrate to the deposition gas and the I/O is greater than about 1.0 and less than about 6.0 during exposure of the substrate to the etchant gas.

4. The method of claim 1, wherein the increase in pressure in the process chamber during exposure to the etchant gas increases the substrate temperature and during exposure to the purge gas, the chamber pressure is decreased thereby decreasing the substrate temperature.

5. The method of claim 4, wherein the pressure in the process chamber during exposure to the etchant gas is at between about two to about ten times the pressure in the process chamber during exposure of the substrate to the deposition gas.

6. The method of claim 4, wherein the temperature in the process is maintained below about 800° C. during the entire process.

7. The method of claim 5, wherein the temperature in the process is maintained below about 750° C. during the entire process.

8. A method of selectively and epitaxially forming a silicon containing material on a substrate surface comprising:
   placing a substrate comprising a monocrystalline surface and at least a dielectric surface into a process chamber, the process chamber including a first radial gas flow zone and second radial gas flow zone containing the substrate, each of said radial zones in separate fluid communication with a gas source for differentially controlling gas flow to the first radial zone and second radial zone to provide a gas flow ratio of the first radial zone to the second radial zone of the substrate;
   flowing a gas consisting essentially of deposition gas comprising a silicon-containing deposition gas into the process chamber at a first pressure and into the first radial zone and second radial zone to provide deposition gas flow ratio of the first radial zone to the second radial zone of less than one; and
   subsequently stopping the flow of deposition gas to the process chamber, increasing the pressure in the process chamber to a second pressure and flowing an etchant gas into the first radial zone and second radial zone of process chamber at an etchant gas flow ratio of the first radial zone gas flow to second radial zone gas flow of greater than one;
   subsequently stopping the flow of etchant gas to the process chamber and flowing a purge gas into the process chamber; and
   repeating at least once the sequential steps of flowing the deposition gas, flowing the etchant gas and flowing the purge gas until a silicon-containing material with a desired thickness is formed.

9. The method of claim 8, wherein the increase in pressure in the process chamber during exposure to the etchant gas increases the substrate temperature, and during exposure to the purge gas, the chamber pressure is decreased thereby decreasing the substrate temperature.

10. The method of claim 9, wherein the second pressure is between about 2 and 10 times the first pressure.

11. The method of claim 10, wherein the ratio of the gas flow of the first radial zone to the second radial zone during flow of the deposition gas is between about 0.2 and 1.0.

12. The method of claim 10, wherein the ratio of gas flow of the first radial zone to the second radial zone during the flow of etchant gas is greater than about 1.0 and less than about 6.0.

13. A method of selectively and epitaxially forming a silicon containing material on a substrate surface comprising:
   placing a substrate comprising a monocrystalline surface and at least a dielectric surface into a process chamber, the process chamber including a first radial gas flow zone and second radial gas flow zone containing the substrate, each of said radial zones in separate fluid communication with a gas source for differentially controlling gas flow to the first radial zone and second radial zone to provide a gas flow ratio of the first radial zone to the second radial zone of the substrate;
   performing a deposition step comprising flowing a gas consisting essentially of a deposition gas comprising a silicon-containing gas into the process chamber during which no etchant gas is flowed into the process chamber, the gas flow ratio of the first radial zone to the second radial zone being less than one;
   performing an etching step comprising flowing an etchant gas into the process chamber during which no silicon-containing gas is flowed into the process chamber, the gas flow ratio of the first radial zone to the second radial zone being greater than one; and
   performing a purging step during which a purging gas is flowed, wherein a single process cycle comprises a deposition step, an etching step and a purging step and the process cycle is repeated at least once, and gas is flowed to the first zone and second zone to provide a pressure in the process chamber and a gas flow ratio between the first radial zone and second radial zone during each of the deposition step, etching step and purging step and at least one of the pressure in the process chamber or the gas flow ratio is different during the deposition step and the etching step.

14. The method of claim 13, wherein the pressure in the process chamber is lower during the deposition than during etching, resulting in a lower substrate temperature during deposition than during etching.

15. The method of claim 13, wherein the first radial zone comprises an inner radial zone of the process chamber and the second radial zone comprises an outer radial zone of the chamber.

16. The method of claim 13, wherein the pressure during etching is at least twice the pressure during deposition.

17. The method of claim 16, wherein the process is performed at a temperature of less than about 800° C.

* * * * *